United States Patent [19]
Nishimura

[11] Patent Number: 5,306,529
[45] Date of Patent: Apr. 26, 1994

[54] PROCESS FOR FORMING AN OHMIC ELECTRODE ON A DIAMOND FILM INVOLVING HEATING IN A VACUUM ATMOSPHERE

[75] Inventor: Kouzo Nishimura, Kobe, Japan

[73] Assignee: Kabushiki Kaisha Kobe Seiko Sho, Kobe, Japan

[21] Appl. No.: 816,722

[22] Filed: Jan. 3, 1992

[30] Foreign Application Priority Data

Jan. 8, 1991 [JP] Japan .................. 3-000716

[51] Int. Cl.$^5$ ........................ B05D 3/06
[52] U.S. Cl. .................... 427/526; 427/530; 427/531; 427/533; 204/192.15; 204/192.17
[58] Field of Search ............... 427/113, 77, 96, 123, 427/124, 125, 38, 39, 523, 526, 531, 533, 535, 545, 562, 530; 204/192.11, 192.15, 192.17

[56] References Cited

U.S. PATENT DOCUMENTS

| | | | |
|---|---|---|---|
| 4,296,144 | 10/1981 | Maby et al. | 427/38 |
| 4,646,282 | 2/1987 | Mizuno et al. | 369/173 |
| 4,833,328 | 5/1989 | Prins et al. | 437/3 |
| 5,006,914 | 4/1991 | Beetz, Jr. | 357/61 |
| 5,068,020 | 11/1991 | Chu et al. | 204/192.11 |
| 5,075,764 | 12/1991 | Yamazaki | 437/209 |
| 5,087,322 | 2/1992 | Lillienfeld et al. | 437/203 |

FOREIGN PATENT DOCUMENTS 0209257  1/1987  European Pat. Off. .

Primary Examiner—Marianne Padgett
Attorney, Agent, or Firm—Oblon, Spivak, McClelland, Maier & Neustadt

[57] ABSTRACT

Herein described is a process for forming ohmic electrodes to a diamond film, comprising the steps of implanting the ions of at least one element selected from the group consisting of B, Li, Na, Ar, C, Ti, W, Ta, Mo, Fe, Ni and Co on the diamond film at the surface areas to be formed with electrodes by an ion implantation method so as to form interface levels in the vicinity of the surface areas to be formed with electrodes, forming electrodes to the ion implanted areas, and heating the diamond film formed with the electrodes at a temperature of 400° C. or more. With this process charge carriers can be moved between electrodes and the diamond film through the interface levels to thereby obtain ohmic electrode diamond film contacts, and also the surface recombination speed of the charge carriers is increased for reducing the contact resistances between the electrodes and the diamond film to thereby obtain ohmic electrode-diamond film contacts each having the small contact resistance. In addition, by heating, the contact resistance is furthermore reduced.

1 Claim, 3 Drawing Sheets

IMPLANTATION OF B ION

FORMATION OF Pt FILM

PROCESS FOR FORMING AN OHMIC ELECTRODE ON A DIAMOND FILM INVOLVING HEATING IN A VACUUM ATMOSPHERE

BACKGROUND OF THE INVENTION a) Field of the Invention:

The present invention relates to a process for forming ohmic electrodes to a diamond film so as to obtain ohmic electrode-diamond film contacts each having the small contact resistance.

b) Description of the Related Art:

Diamond has high hardness and high thermal conductivity, and also has an excellent stability against heat, radiation and chemicals. It has been known that diamond films can be considerably easily formed by vapor phase synthesis using a chemical vapor deposition (CVD) apparatus. The thus formed diamond films have been used as coatings for speaker diaphragms, heat sinks for ICs and so on. Meanwhile, diamond is an electrical insulating material but can exhibit the semiconducting property by being doped with boron (B) or the like. The B-doped semiconducting diamond has a band gap larger than that of silicon (Si), silicon carbide (SiC) or the like, and hence is expected to be applicable in a high temperature region as compared with Si, SiC or the like. In order to apply the diamond having such properties to heat sinks for ICs and high temperature ICs, there has been required a technique for forming ohmic electrodes to an undoped diamond film or semiconducting diamond film, that is, ohmic diamond-electrode contacts.

The following two techniques have been known to form ohmic contacts to diamond. According to the first conventional technique, electrodes of carbide forming metals such as tantalum (Ta) are formed on the surface of a bulk semiconducting diamond by vacuum deposition, and are then heated by electron beams in vacuum to form ohmic contacts to diamond (A.T. Collins and others, Diamond Research, p. 19, 1970). Further, in place of the heating by electron beams, the semiconducting diamond formed with electrodes on its surface, that is, the whole of the sample is heated in a vacuum chamber to form ohmic contacts (Metallization of Semiconducting Diamond, K. L. Moazed and others, Material Research Society, Boston, 1989). According to the first conventional technique, while the mechanism for forming ohmic contacts being not necessarily clear, it is considered that carbide is formed at the interface between the semiconducting diamond surface and the carbide forming metal electrode by heating, to thereby reduce the contact resistance.

According to the conventional second technique, Ar ions are irradiated with an acceleration voltage of several keV on a semiconducting diamond at the surface areas to be formed with electrodes, and electrodes of Au are formed on the Ar ion irradiated areas, to form ohmic contacts (C.B.Child and others, Fourth Annual SDIO/IST-ONR, Diamond Technology Initiative Symposium, Lecture No. ThP2, Crystal City, Va, 1989). According to this second technique, the surface area to be formed with each electrode in the semiconducting diamond is transformed into graphite, to thereby reduce the contact resistance.

However, in the first conventional technique, since carbide is formed at the interface between the diamond and each carbide forming electrode to form the carbide, the kinds of electrode materials are limited to the carbide forming metals. Further, in the second conventional technique, since the surface area of the diamond to be formed with each electrode is merely transformed into graphite, reduction in contact resistance is restricted.

SUMMARY OF THE INVENTION

An object of the present invention is to provide a process for forming ohmic electrodes to a diamond film so as to obtain ohmic electrode-diamond film contacts each having the small contact resistance.

To achieve the object, in a first aspect of the present invention, there is provided a process for forming ohmic electrodes to a diamond film, comprising the steps of:

implanting the ions of at least one element selected from the group consisting of B, Li, Na, Ar, C, Ti, W, Ta, Mo, Fe, Ni and Co on the diamond film at the surface areas to be formed with electrodes by an ion implantation method so as to form interface levels in the vicinity of the above surface areas to be formed with electrodes, and forming electrodes to the ion implanted areas.

In a second aspect of the present invention, there is provided a process for forming electrodes to a diamond film, comprising the steps of:

implanting the ions of at least one element selected from the group consisting of B, Li, Na, Ar, C, Ti, W, Ta, Mo, Fe, Ni and Co on the diamond film at the surface areas to be formed with electrodes by an ion implantation method so as to form interface levels in the vicinity of the above surface areas to be formed with electrodes, forming electrodes to the ion implanted areas, and heating the diamond film formed with the electrodes at a temperature of 400° C. or more.

In the processes of the first and second aspects of the invention, the ions of at least one element selected from the group of consisting of the later-described elements are implanted on an undoped or doped diamond film at the surface areas to be formed with electrodes by an ion implantation method so as to form the interface levels in the vicinity of the above surface areas to be formed with electrodes. Consequently, lattice defects are generated which yields a lot of interface levels in the vicinity of the diamond film surface. It is difficult to obtain the desired interface levels by sputtering because diamond has the large C—C covalent bond constituting the $SP^3$ bond. In this case, therefore, there is employed an ion implantation method capable of imparting a large energy to the ion as compared with a sputtering method.

By forming of metal electrodes on the thus ion implanted areas, charge carriers can move between the diamond film and the metal electrodes through the interface levels. Thus, the ohmic electrode-diamond film contacts can be obtained. Further, by the interface levels formed through ion implantation, charge carriers are increased in the surface recombination velocity on the surface of the diamond film, thereby reducing the contact resistances between the electrodes and the diamond film. As a result, there can be achieved ohmic electrodes-diamond film contacts each having the small contact resistance.

In the processes of the first and second aspects of the invention, the elements suitable for the ion implantation are as follows: Boron (B), being also acceptor dopant in diamond; Lithium (Li) and Sodium (Na), being also donor dopant; Argon (Ar) and Carbon(C), being available at lower cost as well as being easy in ionization; Titanium (Ti), Tungsten (W), Tantalum (Ta) and Molybdenum (Mo), being liable to form carbide; and Iron (Fe), Nickel (Ni) and Cobalt (Co), being liable to be solid-soluble to carbon of the diamond film and also being larger in the diffusion coefficient to carbon as compared with Ti and W. In this case, the elements may be used independently or in combination of two kinds or more.

According to the second aspect of the invention, there is provided a process for reducing the contact resistances between electrodes and a diamond film, comprising the steps of:

implanting the ions on the diamond film at the surface areas to be formed with electrodes by an ion implantation method so as to form interface levels in the vicinity of the surface areas to be formed with electrodes, forming electrodes to the ion implanted areas, and heating the diamond film formed with the electrodes at a temperature of 400° C. or more.

In this case, by heating the diamond film which is formed with metal electrodes on its surface areas implanted by B ions, the implanted B ions are activated. As the number of the activated B ions becomes $10^{20}/cm^3$, there is formed a P+ layer in the vicinity of the surface areas of the diamond film. Since the P+ layer is remarkably degenerated, the width of the depletion layer is made narrower, thereby allowing charge carriers to move between the metal electrode and the P+ layer by tunnelling. Consequently, the contact resistance between the metal electrode and the diamond film is made smaller. In addition, the heating temperature is required to be within the range from 400° C. to 1000° C., in order to activate the implanted B ions and hence to reduce the contact resistance.

The above phenomenon can be seen in the case of implanting the ions of Li or Na. That is, by heating the diamond film which is formed with metal electrodes on its surface areas implanted by Li ions (or Na ions), the implanted Li ions (or Na ions) are activated. As the number of the activated Li ions (or Na ions) becomes $10^{20}/cm^3$, there is formed a n+ layer in the vicinity of the surface areas of the diamond film. Since the n+ layer is remarkably degenerated, the width of the depletion layer is made narrower, thereby allowing charge carriers to move between the metal electrode and the n+ layer by tunnelling. Consequently, the contact resistance between the metal electrode and the diamond film is made smaller. In addition, the heating temperature is required to be within the range form 400° C. to 1000° C., in order to activate the implanted B ions and hence to reduce the contact resistance.

Subsequently, in the case of implanting the ions of Ti, W, Ta, or Mo according to the second aspect of the invention, by heating a diamond film on which the ions of the above carbide forming metal element are implanted and metal electrodes are formed thereat, the carbon in the diamond film is reacted with the above metal element to form carbide below the metal electrodes of the diamond film, to thereby reduce the contact resistances between the electrodes and the diamond film. In addition, the formed carbide is TiC, WC, TaC and/or $Ta_2C$, or $Mo_2C$. The heating temperature is required to be within the range from 400° C. to 1000° C., in order to activate the implanted B ions and hence to reduce the contact resistance.

In the case of implanting the ions of Fe, Ni or Co according to the second aspect of the invention, by heating the diamond film on which the ions of the metal element being liable to solid-soluble to the carbon in the diamond film and also being larger in the diffusion coefficient to the carbon as compared Ti or W are implanted and the metal electrodes are formed thereat, the carbon in the diamond film is diffused to form graphite below the electrodes of the diamond film, thereby reducing the contact resistance between each electrode and the diamond film. Graphite is excellent in wettability to the diamond film. In addition, the heating temperature is required to be within the range from 400° C. to 1000° C., in order to activate the implanted B ions and hence to reduce the contact resistance.

BRIEF DESCRIPTION OF THE DRAWINGS

The above and other objects, features and advantage of the present invention will be become more apparent from the following description taken in connection with accompanying drawings, in which.

DETAILED DESCRIPTION OF THE PREFERRED EMBODIMENTS

Hereinafter the present invention will be described according to the preferred embodiments with reference to the FIG. 1 to 5.

Example 1

Ohmic electrodes were formed on a p-type semiconducting diamond film in the following procedure. FIG. 1 is a schematic view showing a process for forming ohmic electrodes according to the present invention.

(1) One side of a polycrystalline $Al_2O_3$ substrate 1 (purity: 99.3%, thickness: 0.5 mm, size: 20 mm × 10 mm) was buffed for about 1 hour with a diamond paste having an average particle size of 0.25 μm, thereby forming an abraded surface. B-doped polycrystalline p-type semiconducting diamond film 2 was deposited on the $Al_2O_3$ substrate 1 to a thickness of 1.5 to 3 μm by vapor phase synthesis using a microwave plasma chemical vapor deposition (CVD) apparatus. As a reaction gas, there was used a source gas of a $CH_4$-$H_2$ mixture ($CH_4$ concentration: 0.5%) which was added with a doping gas of diborane ($B_2H_6$) gas (diluted by $H_2$) in the concentration of 0.1 ppm to the whole gas flow rate 100 cc/min.(sccm). It took 7 to 10 hours until the diamond film was deposited to a desired thickness.

(2) The $Al_2O_3$ substrate 1 on which the p-type semiconducting diamond film 2 was deposited was cut by a dicing saw to obtain individual chips of 5 mm × 5 mm in size. Each chip was heated for 5 min. at 80° C. in sulfic acid to remove organic matters, and then cleaned by pure water. Furthermore, the chip was subjected to RCA cleaning (cleaning agent: $H_2O_2+NH_3OH+H_2O$, $H_2O_2+HCl+H_2O$) for 5 min. to remove heavy metals and alkali components, followed by cleaning with pure water, to be dried by heating for 5 min. at 120° C. in an oven.

Figure 1A:
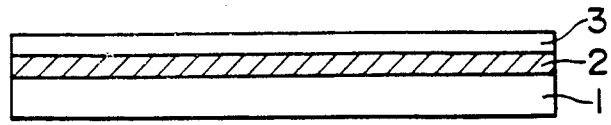
FIG. 1, parts (a), (b), (c), (d) and (e), is a schematic view showing a process of forming ohmic electrodes according to the present invention.
Figure 1B:
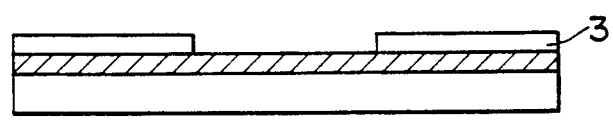
Figure 4:
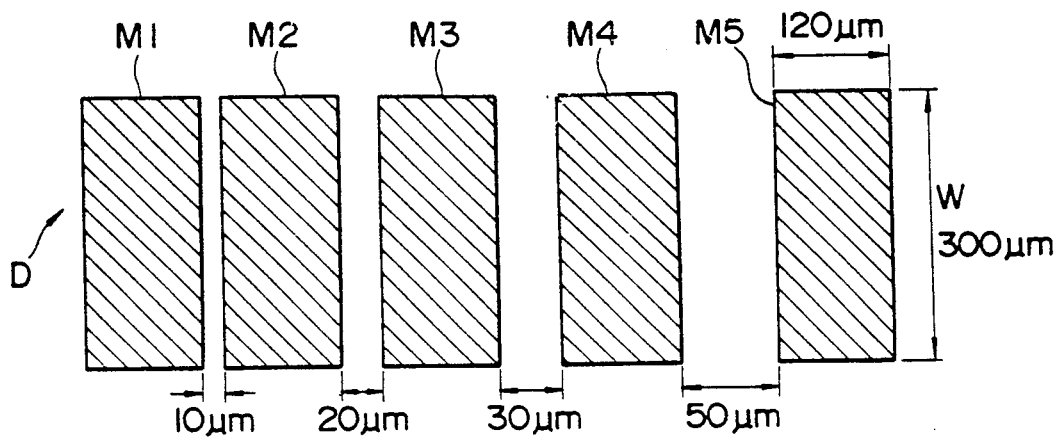
FIG. 4 is a schematic view showing an electrode pattern used in the examples according to the present invention.

(3) Following the above cleaning, a photoresist 3 was coated on the surface of the p-type semiconducting diamond film 2, as shown in FIG. 1(a). Subsequently, an electrode pattern image as shown in FIG. 4 described later was transferred to the photoresist 3 to be developed, and the photoresist of the area to be formed with electrodes was then removed to thus open the contact windows as shown in FIG. 1(b). For the sake of understanding, FIG. 1(b) shows one area to be formed with an electrode which is picked up from the electrode pattern shown in FIG. 4.

Figure 1C:
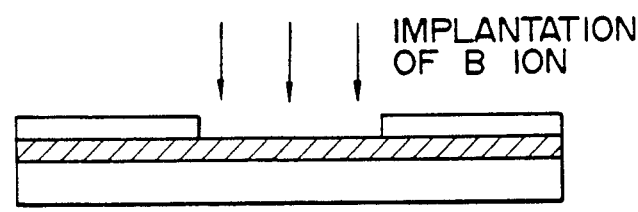

(4) B ions were implanted by an ion implantation apparatus on the photoresist removed areas to be formed with electrodes so as to form the interface levels in the vicinity of the surface areas of the p-type semiconducting diamond film 2, as shown in FIG. 1(c).

The above ion implantation was carried out at room temperature with the B ion doped amount of $10^{13}$ to $10^{16}/cm^2$ (ions/$cm^2$) and the acceleration voltage of 60 keV.

Figure 1D:
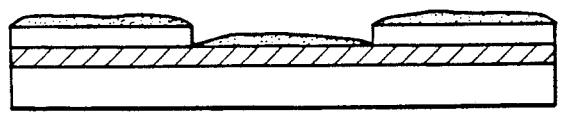
Figure 1E:
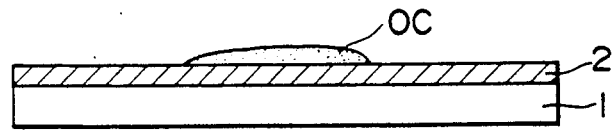

(5) After the B ion implantation, a Platinum (Pt) film was deposited by sputtering on the whole surface as shown in FIG. 1(d), followed by removing the unnecessary photoresist and Pt film areas by photoetching (lift off), to thus form Pt electrodes shown as a reference numeral OC in FIG. 1(e). The above sputtering was carried out with the condition of an input power of 100 W, Ar gas pressure of $10^{-2}$ Torr, gas flow rate of 10 cc/min.(sccm), film formation time of 30 min and Pt electrode thickness of about 2000 Å.

After the formation of Pt electrodes on the surface of the p-type semiconducting diamond film 2 deposited on the $Al_2O_3$ substrate 1, both the contact resistance Rc and current-voltage characteristic (I-V characteristic) between each Pt electrode and the p-type semiconducting diamond film were measured. Prior to the description of the measurement result, the procedure for measuring the contact resistance Rc, being common to the other examples described later, will be described with reference to FIG. 4 and FIG. 5.

In FIG. 4, reference numerals M1 to M5 show respective electrodes (which are made of Pt in this examples), each having a size of 300 μm in width and 120 μm in length. These electrodes M1 to M5 are formed on the surface of the diamond film D (which is made of p-type semiconducting diamond in this examples) according to an electrode pattern as shown in FIG. 4. The electrode pattern is called TLM (Transmission Line Model) and is widely used for measuring the contact resistance between the electrode and the diamond film.

Figure 5:
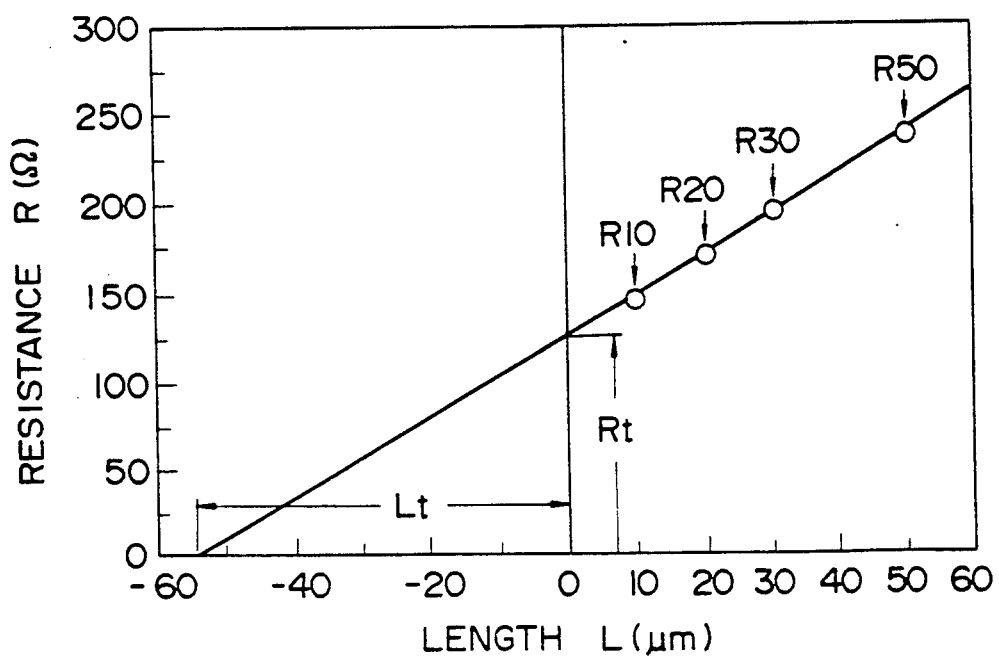
FIG. 5 is a schematic view showing a procedure for measuring an electrode in the examples according to the present invention.

First, a probe is brought in point-contact with the electrodes M1 and M2 to measure the resistance (Ω) across them. The obtained resistance R10 is plotted relative to L=10 μm as shown in FIG. 5 wherein the horizontal axis is length L(μm) and the vertical axis is resistance R (Ω). Subsequently, the probe is brought in point-contact with the electrodes M2 and M3 to measure resistance across them. The obtained resistance R20 is plotted relative to L=20 μm. Hereinafter, in the same manner, the resistance R30 between the electrodes M3 and M4, and the resistance R50 between the electrodes M4 and M5 are measured to be plotted. Then, the straight line through the above respective plotted resistances is extended, to obtain the length Lt(μm) at the resistance R=0 and also the resistance Rt (Ω) at the length L=0. From the resistance Rt (Ω), length Lt(μm) and the width W (300 μm) of the electrode, the contact resistance Rc(Ωcm²) is calculated on the basis of the expression of $Rc = Rt \times Lt \times W/4$. In addition, the measurement is performed at room temperature (about 24° C.).

Figure 2:
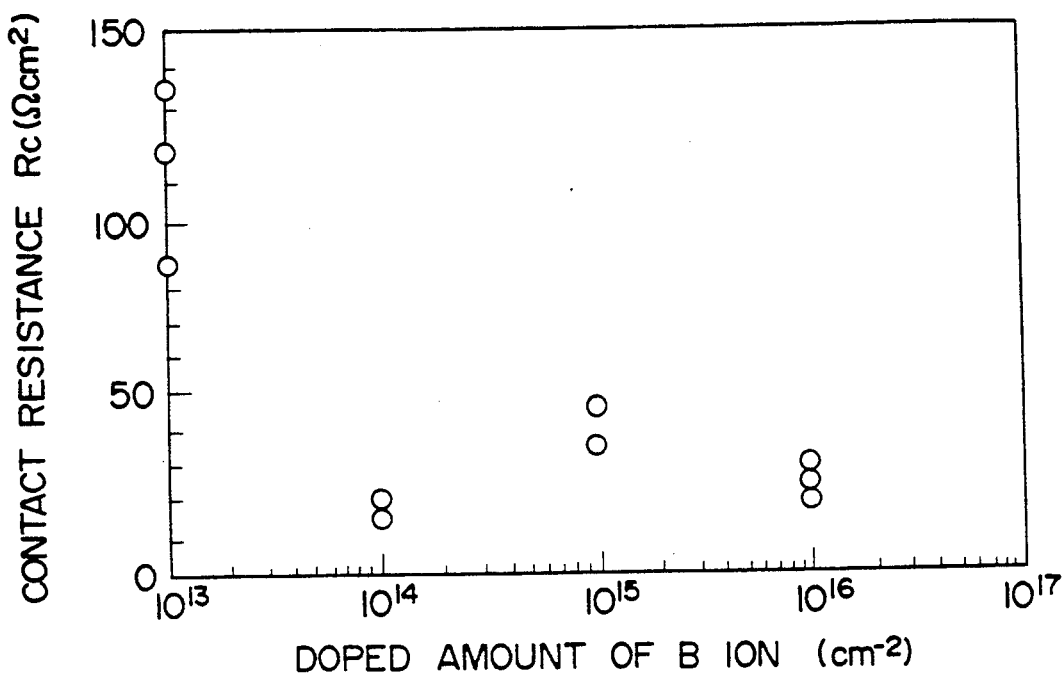
FIG. 2 is a graph showing one of contact resistance measurement results according to the first aspect of the present invention.

According to the above-mentioned measuring procedure, the contact resistance Rc between each Pt electrode and the p-type semiconducting diamond film was measured, which gave the result shown in FIG. 2. For comparison, the contact resistance Rc was measured for a comparative sample formed with Pt electrodes without implantation of B ion. In this case, the contact resistance Rc is about 500Ω cm².

On the contrary, as is apparent from FIG. 2, the sample in Example 1 can be extremely increased in its contact resistance. In particular, the sample implanted by B ion in an amount of $10^{14}/cm^2$ or more shows the contact resistance Rc smaller by one figure or more than that of the comparative sample not implanted by B ion. Further, the current-voltage characteristic between each electrode and p-type semiconducting diamond film lies in a linear relationship, which shows the obtained ohmic Pt electrode/p-type semiconducting diamond film contacts. In the case that the doped amount of B ion was $10^{16}/cm^2$, from the observation during the fabricating process, it was found that the surface of the p-type semiconducting diamond film was blackened to be transformed into graphite.

Example 2

After Pt electrodes were formed on the surface of a p-type semiconducting diamond film deposited on an $Al_2O_3$ substrate in the same manner with the same condition as in Example 1, the sample was heated at 800° C. for 30 min. under vacuum (degree of vacuum: $1 \times 10^{-5}$ Torr or less) in a vacuum vessel. Following the heating, according to the above mentioned measurement procedure, the contact resistance between each Pt electrode and the p-type semiconducting diamond film was measured.

Figure 3:
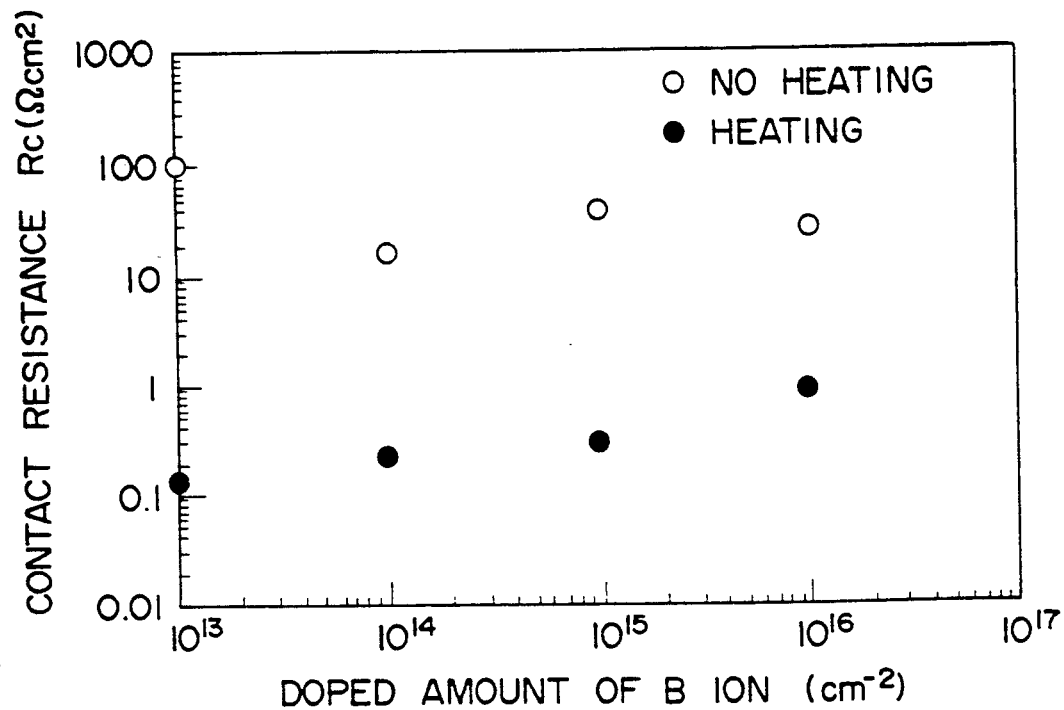
FIG. 3 is a graph showing one of contact resistance measurement results according to the second aspect of the present invention.

The result is shown as a mark ● in FIG. 3. In addition, the contact resistance Rc of the comparative sample being not subjected to heating was measured for comparison. The result is shown as a mark ○ in FIG. 3.

As is apparent from FIG. 3, the sample in Example 2 shows the contact resistance Rc extremely decreased as compared with the comparative sample being not subjected to heating in the whole range of the B ion doped amount. This is because the implanted B ions are activated by heating, to form P+ layer in the vicinity of the surface areas of the p-type semiconducting diamond film. Further, the curret-voltage characteristic between each electrode and p-type semiconducting diamond film lies in a linear relationship, which shows the obtained ohmic Pt electrode/p-type semiconducting diamond film contacts.

Example 3

An undoped diamond film was deposited by vapor phase synthesis on an $Al_2O_3$ substrate to a thickness of 1.5 to 3μ. The vapor phase synthesis was carried out in the same condition as in Example 1 except using a source gas not including $B_2H_6$ gas. In the same procedure as in Example 1, Li ions were implanted on the undoped diamond film at the photoresist removed areas to be formed with electrodes by an ion implantation apparatus so as to form the interface levels in the vicinity of the surface areas of an undoped diamond film. The ion implantation was carried out at room temperature with the Li ion doped amount of $10^{15}/cm^2$ and with acceleration voltage of 40 keV. Following the Li ion implantation, Pt electrodes were formed on the areas to be formed with electrodes according to the electrode pattern as shown in FIG. 4.

A part of the sample 3B which was implanted by Li ions and formed with Pt electrodes thereat was heated at 600° C. for 1 hour in vacuum (degree of vacuum: $1 \times 10^{-5}$ Torr or less) in a vacuum chamber, to thus form a sample 3 C. For comparison, a comparative sample 3A not implanted by Li ions was prepared. For the samples 3A, 3B and 3C, the contact resistances and current-voltage characteristics were measured, respectively.

As a result, the contact resistance Rc was: 1000 $\Omega cm^2$ (sample 3A); 30 $\Omega cm^2$ (sample 3B); and 0.01 $\Omega cm^2$ (sample 3C). With respect to the current-voltage characteristic between each electrode and undoped diamond film, the samples 3B and 3C showed the straight ohmic property, respectively. Meanwhile, in the sample 3A, there existed S-curved non-ohmic components.

As described above, even to the undoped diamond film, there can be formed ohmic electrode-undoped diamond film contacts. In addition, even in the case of implanting the ions of a donor dopant of Na to a diamond, there can be formed ohmic electrode-diamond film contacts.

Example 4

In the same manner as in Example 1, B-doped p type semiconducting diamond film was deposited on an $Al_2O_3$ substrate. Ti ions were implanted on the diamond film at the photoresist removed areas to be formed with electrodes by an ion implantation apparatus so as to form the interface levels in the vicinity of the surface areas of the diamond film. The ion implantation was carried out at room temperature with the Ti ion doped amount of $10^{16}/cm^2$ and with acceleration voltage of 50 keV. Following the ion implantation, Pt electrodes were formed on the areas to be formed with the electrodes according to the electrode pattern as shown in FIG. 4.

A part of a samples 4B which was implanted by Ti ions and Pt electrodes were formed thereat was heated at 800° C. for 1 hour in vacuum (degree of vacuum: $1 \times 10^{-5}$ Torr or less) in a vacuum chamber, to form a sample 4C. For comparison, a comparative sample 4A not implanted by Li ions was prepared. For the samples 4A, 4B and 4C, the contact resistances and current-voltage characteristics were measured, respectively.

As a result, the contact resistance Rc was: 500 $\Omega cm^2$ (sample 4A); 5$\Omega cm^2$ (sample 4B); and 0.001 $\Omega cm^2$ (sample 4C). With respect to the current-voltage characteristic between each electrode and the p-type of semiconducting diamond film, the samples 4B and 4C show the straight ohmic property, respectively. In the case of implanting the ions of W, Ta or Mo liable to form carbide like Ti, there can be obtained ohmic electrode-diamond film contacts each having the small contact resistance.

Example 5

In the same manner as in Example 1, B-doped p-type semiconducting diamond film was deposited on an $Al_2O_3$ substrate. Ni ions were implanted on the diamond film at photoresist removed areas to be formed with electrodes by an ion implantation apparatus so as to form the interface levels in the vicinity of the surface areas of the diamond film. The ion implantation was carried out at room temperature with the Ni ion doped amount of $10^{16}/cm^2$ and with acceleration voltage of 40 keV. Following the ion implantation, Pt electrodes were formed on the areas to be formed with electrodes according to the electrode pattern as shown in FIG. 4.

A part of the sample 5B which was implanted by Ni ions and formed with Pt electrodes thereat was heated at 800° C. for 1 hour in vacuum (degree of vacuum: $1 \times 10^{-5}$ Torr or less) in a vacuum chamber, to form a sample 5C. For comparison, a comparative sample 5A not implanted by Li ions was prepared. For the samples 5A, 5B and 5C, the contact resistances and current-voltage characteristics were measured, respectively.

As a result, the contact resistance Rc was: 500 $\Omega cm^2$ (sample 5A); 60 $\Omega cm^2$ (sample 5B); and 0.1 $\Omega cm^2$ (sample 5C). With respect to the current-voltage characteristic between each electrode and the p-type semiconducting diamond film, the samples 5B and 5C shows the straight ohmic property, respectively. In the case of implanting the ions of Fe or Co liable to be solid-soluble to carbon in the diamond film like Ni and also having a large diffusion coefficient to carbon as compared with Ti and W, there can be obtained ohmic electrode-diamond film contacts each having the small contact resistance.

In addition, Pt was used as an electrode material in the above-described examples. However, the electrode material is limited to Pt and extended to an electrically conductive material such as Au or $TaSi_2$ or electrically conductive non-metal material such as poly Si. The heating may be carried out in non-oxidation atmosphere such as Ar or $N_2$. By implanting the ions of Ar or C ion on the diamond film at the surface areas to be formed with electrodes so as to form interface levels in the vicinity of the surface areas of the diamond film, there can be obtained ohmic electrode-diamond film contacts each having the small contact resistance.

What is claimed is:

1. A process for forming an ohmic electrode, comprising the steps of:

implanting ions of at least one element selected from the group consisting of B, Li, Na, Ti, W, Ta, Mo, Fe, Ni and Co on a surface area of a diamond film, on which electrodes are to be formed, said surface area being fabricated by photolithography, so as to form an interface level in a vicinity of said surface area, forming a metal electrode on the ion implanted area, and heating said metal electrode formed on said diamond film at temperature between 400° C. and 800° C. in vacuum atmosphere of $1 \times 10^{-5}$ Torr or less to decrease contact resistance between said metal electrode and said diamond film.

* * * * *